United States Patent [19]

Rudin

[11] 4,016,483

[45] Apr. 5, 1977

[54] MICROMINIATURE INTEGRATED CIRCUIT IMPEDANCE DEVICE INCLUDING WEIGHTED ELEMENTS AND CONTACTLESS SWITCHING MEANS FOR FIXING THE IMPEDANCE AT A PRESELECTED VALUE

[76] Inventor: Marvin B. Rudin, Suite R101, 555 Middlefield Road, Mount View, Calif. 94040

[22] Filed: June 9, 1975

[21] Appl. No.: 585,075

Related U.S. Application Data

[63] Continuation-in-part of Ser. No. 483,619, June 27, 1974, abandoned.

[52] U.S. Cl. .................................. 323/74; 307/303; 323/80; 323/94 R; 323/97; 357/51; 357/77; 338/92
[51] Int. Cl.[2] .......................................... G05F 3/00
[58] Field of Search ................ 323/74, 79, 80, 81, 323/94 R, 96, 97; 29/626; 357/74–77, 38, 46, 51, 91; 307/33, 303; 340/166 R, 173 R; 338/48, 92, 128, 200, 289, 295

[56] References Cited

UNITED STATES PATENTS

| 2,892,147 | 6/1959 | Bell | 323/94 R |
|---|---|---|---|
| 3,460,026 | 8/1959 | Dow et al. | 323/74 |
| 3,191,151 | 6/1965 | Price | 340/166 R |
| 3,231,810 | 1/1966 | Carson, Jr. | 323/94 R |
| 3,273,143 | 9/1966 | Wasserman | 323/94 R |
| 3,299,338 | 1/1967 | Torii | 323/97 |
| 3,533,088 | 10/1970 | Rapp | 340/173 |
| 3,535,530 | 10/1970 | Cooper et al. | 307/303 X |
| 3,541,430 | 11/1970 | Luger | 323/94 R |
| 3,548,494 | 12/1970 | Haring | 29/626 |
| 3,756,887 | 9/1973 | Cruthers | 307/303 X |

FOREIGN PATENTS OR APPLICATIONS 1,142,789  2/1969  United Kingdom ................ 323/96

Primary Examiner—Gerald Goldberg
Attorney, Agent, or Firm—Boone, Schatzel, Hamrick & Knudsen

[57] ABSTRACT

A microminiature terminal-adjustable integrated circuit impedance device comprising a substrate, a plurality of impedance elements formed on the substrate with each impedance element having an impedance, a first input terminal, an output terminal, a plurality of electrically permanently alterable contactless switching elements formed on the substrate, each of the switching elements being associated with one of the plurality of impedance elements and having initially a first switching state and being permanently alterable by application of electrical energy to an opposite switching state, an interconnecting means interconnecting the impedance elements and the switching elements in a first circuit configuration between the first input terminal and the output terminal such that the impedance between the first input terminal and the output terminal is of a first value, and a plurality of adjustment terminals each being connected to a different one of the plurality of switching elements for facilitating the application of electrical energy thereto to cause such switching elements to change to the opposite switching state, whereby the application of electrical energy to selected ones of the adjustment terminals causes a second circuit configuration having a preselected second value to be formed between the first input terminal and the output terminal. Each electrically permanently alterable contactless switching element is comprised of fusible conductive links or shortable diodes, singly or in combination. In the preferred embodiment the device comprises resistive elements fabricated with state-of-the-art thin film or monolithic integrated circuit technology and serves as a variable resistor or as a variable voltage divider performing the function of a fixable contactless trimming potentiometer.

37 Claims, 21 Drawing Figures

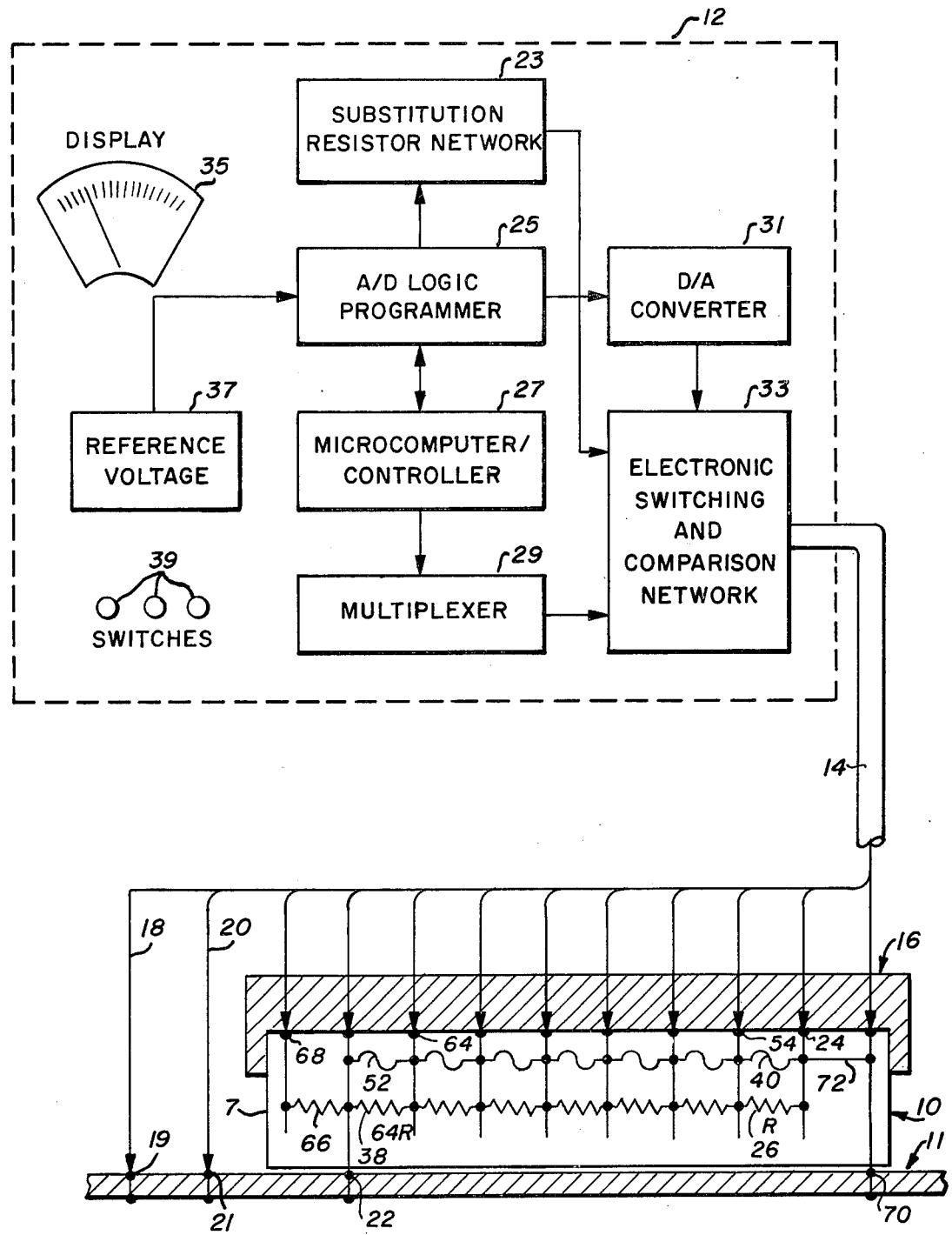
Fig_1

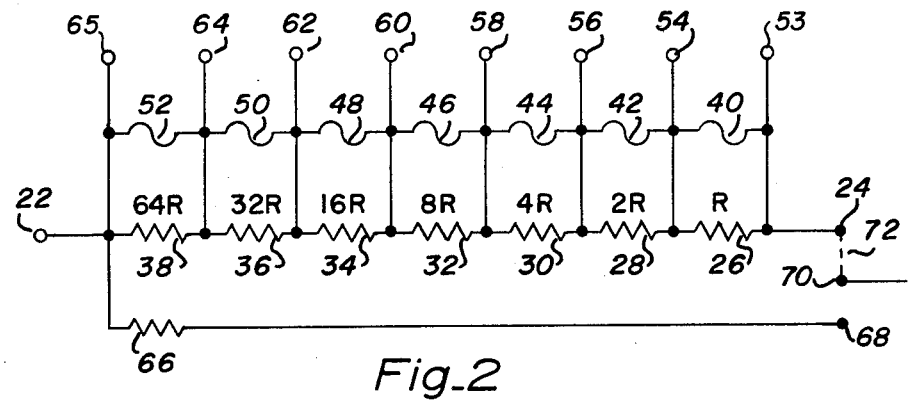
Fig_2
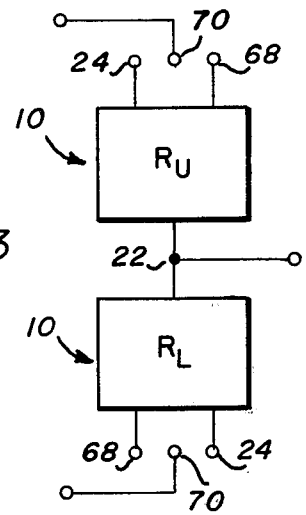
Fig_3
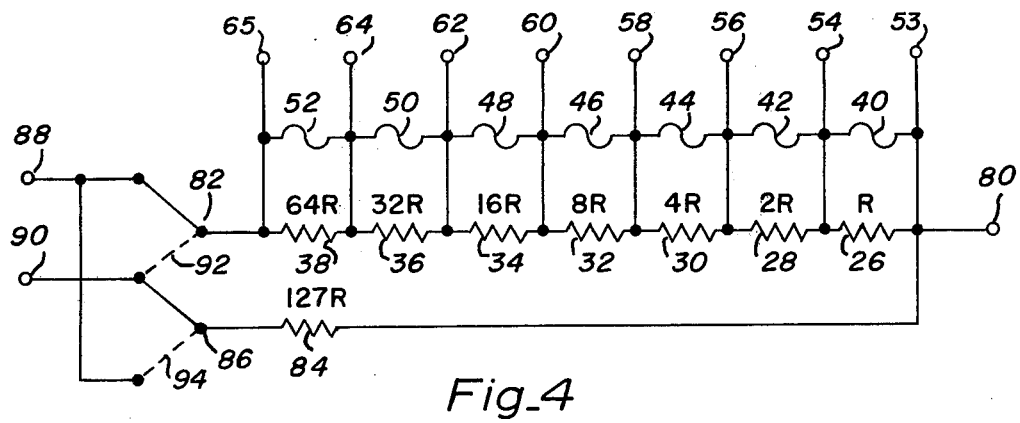
Fig_4

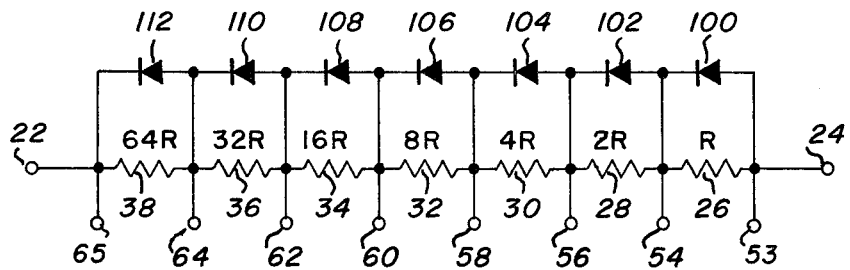
Fig_5
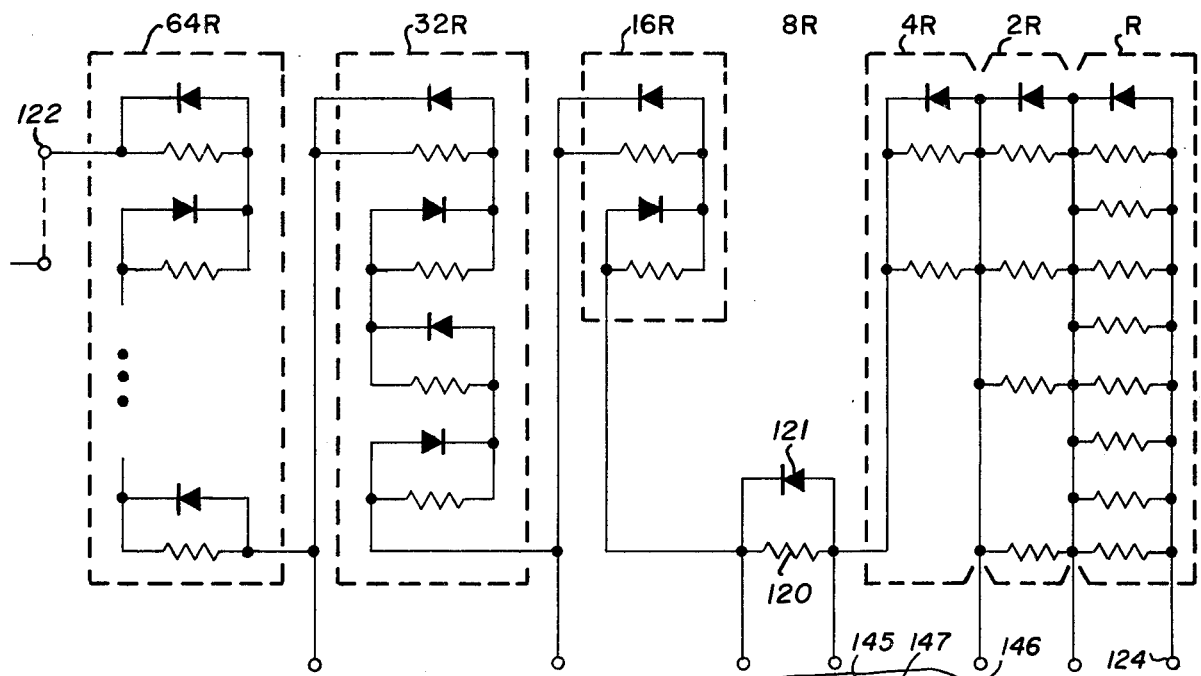
Fig. 6
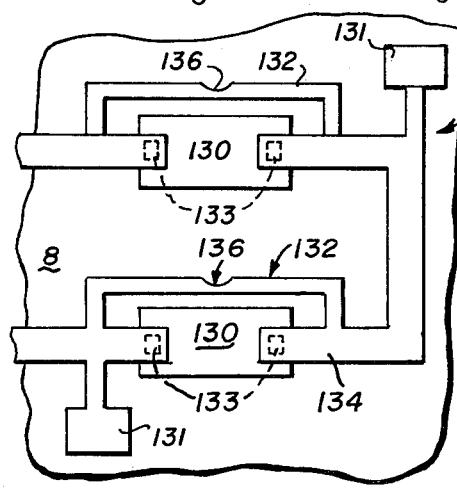
Fig_7
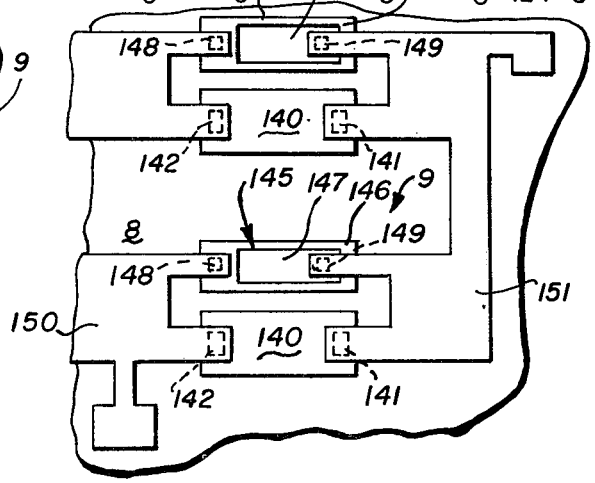
Fig_8

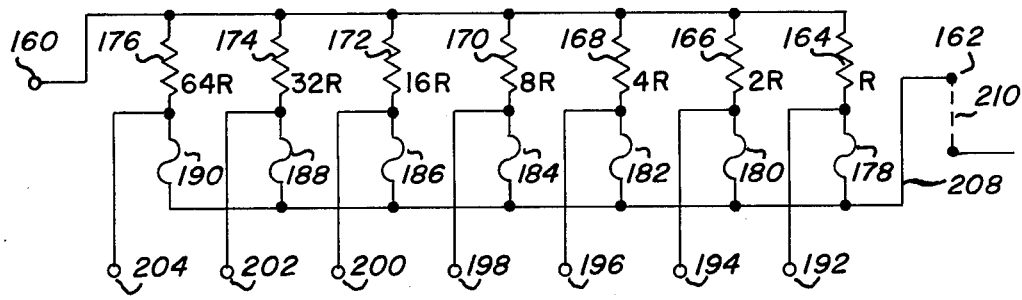
Fig_9
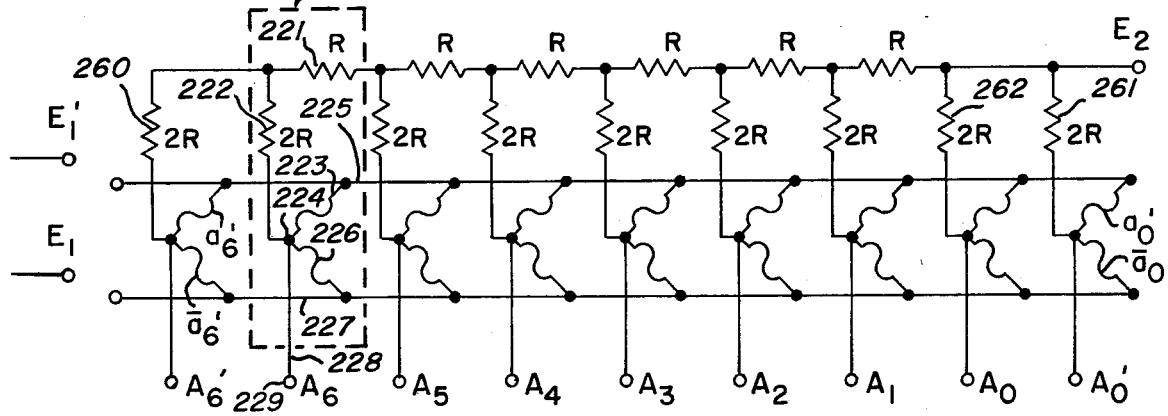
Fig_10
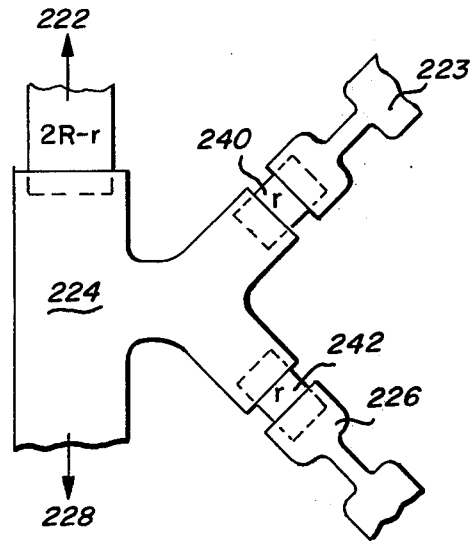
Fig_11
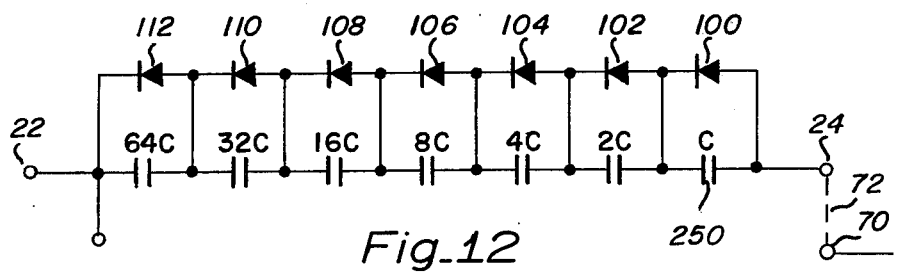
Fig_12

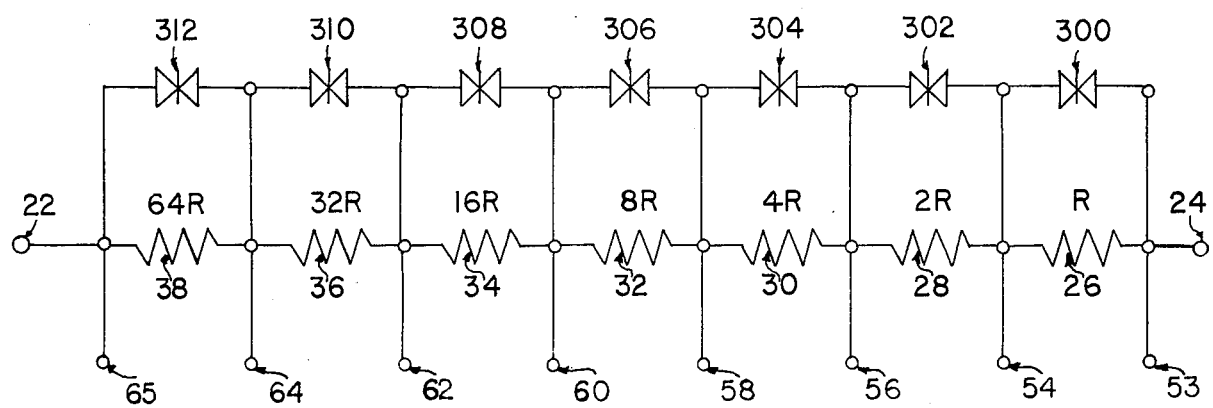
Fig_13
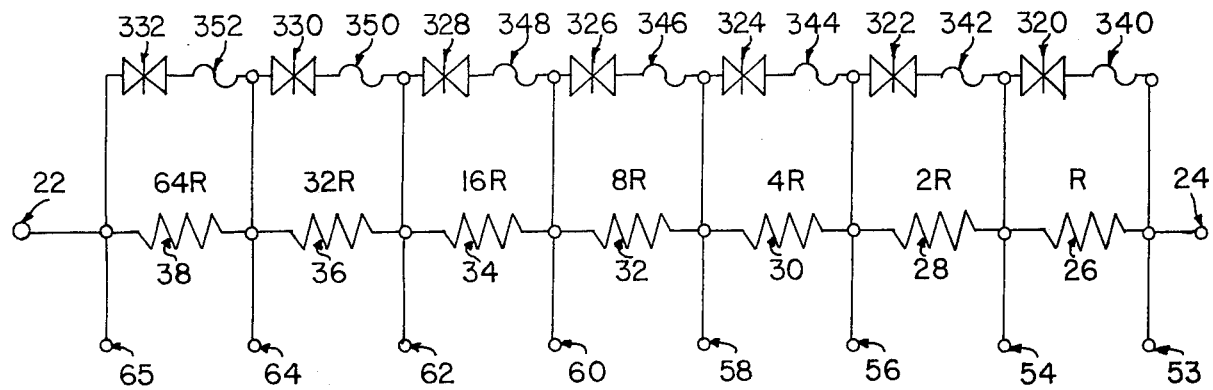
Fig_14
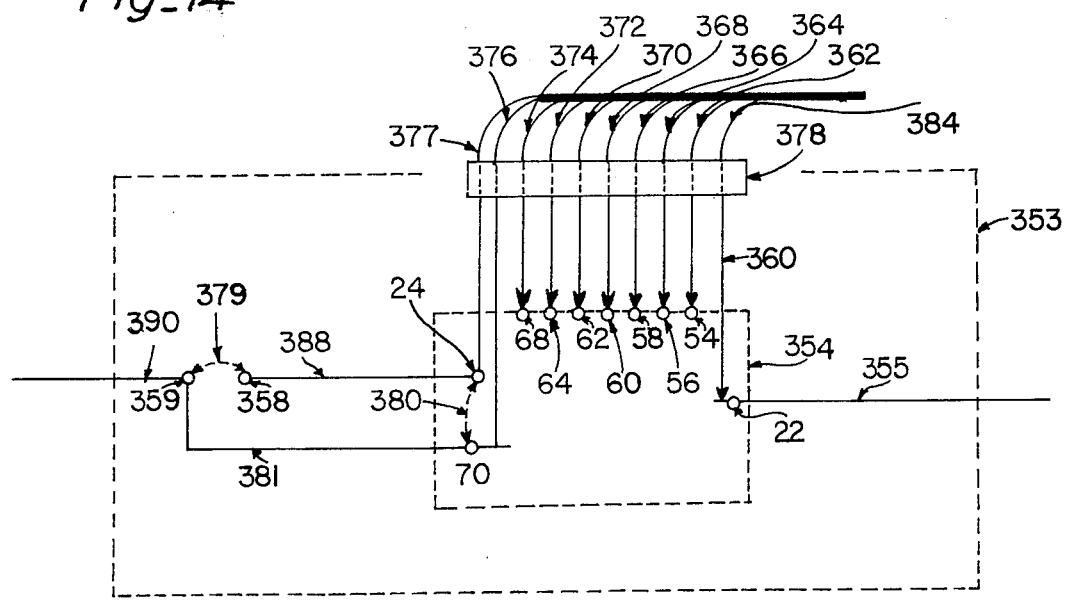
Fig_15

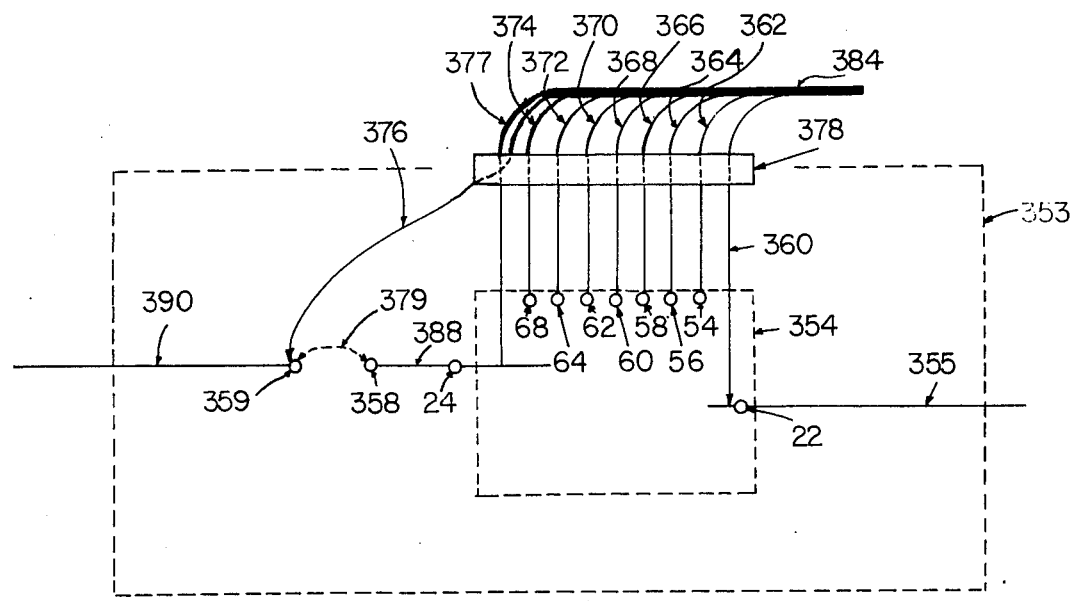
Fig_16
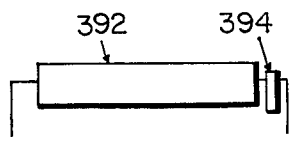
Fig_17c
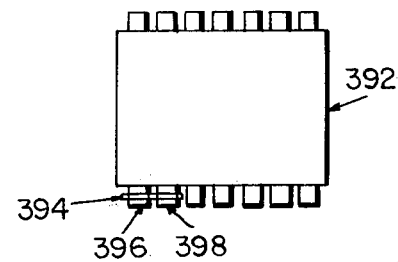
Fig_17a
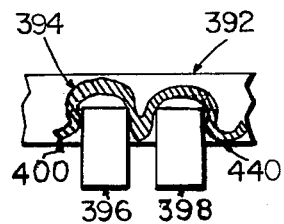
Fig_17d
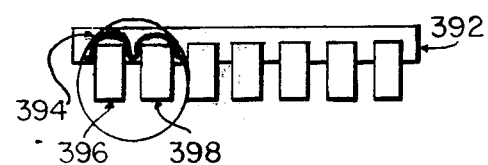
Fig_17b
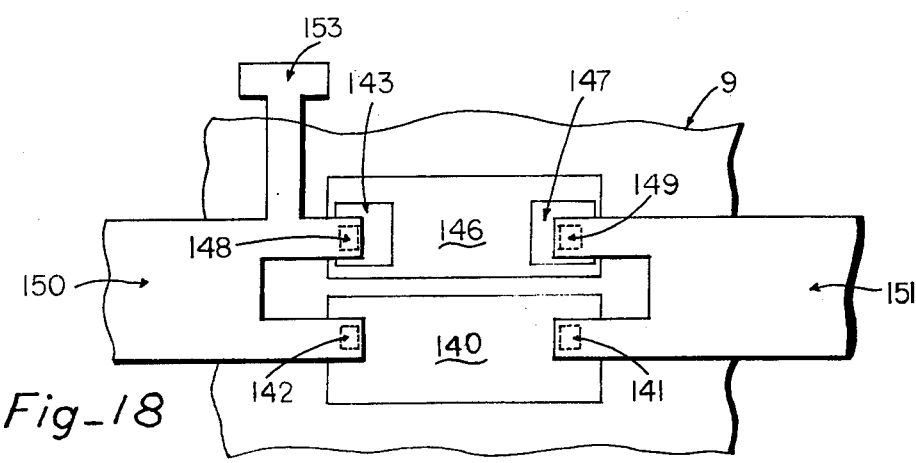
Fig_18

MICROMINIATURE INTEGRATED CIRCUIT IMPEDANCE DEVICE INCLUDING WEIGHTED ELEMENTS AND CONTACTLESS SWITCHING MEANS FOR FIXING THE IMPEDANCE AT A PRESELECTED VALUE

This is a continuation-in-part of application Ser. No. 483,619 filed June 27, 1974, now abandoned.

BACKGROUND OF THE INVENTION

1. Field of the Invention

This invention relates generally to a microminiature integrated circuit adjustable impedance network and more particularly, to a microminiature integrated circuit resistance network comprising a plurality of weighted resistance elements which may be selectively interconnected to provide a predetermined fixed resistance, or resistance ratio.

2. Description of the Prior Art

For many years military and industrial reliability specialists have been dissatisfied with the vulnerability of sliding contact adjustable resistors and trimming potentiometers to variation after the impedance has been adjusted to a predetermined value. Generally the impedance of trimming potentiometers built into electronic equipment is adjusted to the desired value with a single one-time adjustment either at the equipment factory or at a field installation of the equipment. However, variations have occurred regardless of where the adjustment is made and whether the sliding contact potentiometer is of the wire-wound or of the nonwire-wound types. Nonwire-wound potentiometers are typically fabricated from materials such as cermet, carbon film, hot-molded carbon, thin film metal and conductive plastic.

Adjustment is especially affected vibration, temperature cycling, and chemical corrosion. For example, under vibration conditions, it has been found that the variation of the contact position on a potentiometer may cause an end-to-contact slider resistance that changes by as much as 3 percent of the end-to-end resistance of the potentiometer. It should also be recognized that the resolution of wire-wound potentiometers inherently, in addition to contact variation, changes in steps.

In the prior art, trimming potentiometers are available to provide linearly adjustable resistances in a miniature package. Typically, several materials are used to fabricate the trimming potentiometers, with the most common kinds of materials including resistance wire, cermet thick film, hot-molded carbon and carbon film. In general, the wire-wound types are more stable with temperature variation and have a lower contact resistance than the thick film elements. As previously mentioned, wire-wound potentiometers have an inherent resolution disadvantage because of the step resistance changes which occur as the sliding contact, or wiper, wipes from one turn to the next, a disadvantage which does not occur with the continuous nonwire-wound type. However, the "infinite" ressolution associated with the continuous elements is often of little real value because of the fact that in all miniature trimming potentiometers, the contact setting can change after its initial setting by significant amounts, especially when the potentiometer is exposed to shock, vibration, and chemical corrosion.

Some of the key parameters of the several types of trimming potentiometers have been investigated. With respect to these parameters it has been found that a wire-wound trimming potentiometer having an end-to-end resistance of about 10 ohms has a manufacturing tolerance of approximately ±20%, an end-to-slider resistance resolution of about 1%, end-to-slider resistance variation after vibration of about 2%, and a slider potentiometer voltage variation after vibration of about 3%; that a wire-wound trimming potentiometer having a full scale end-to-end resistance of about 100K ohms has a manufacturing tolerance of ±5%, an end-to-slider resistance setting resolution of about 0.1%, an end-to-slider resistance variation after vibration of about 0.5%, and a slider potentiometer voltage variation after vibration of about 0.5%. In contrast, a cermet potentiometer having a resistance of about 10 ohms has a manufacturing tolerance of about ±20%, an end-to-slider resistance setting resolution of about 0.05%, an end-to-slider variation after vibration of about 3%, and a slider potentiometer voltage variation after vibration of about 3%.

Some of the particular disadvantages of the principal types of trimming potentiometers are as follows: a wire-wound trimming potentiometer has step resolution, contact noise, contact resistance which increases with corrosion and load life, a poor high-frequency response, a relatively poor reliability, a substantial material cost, a high adjustment cost due to the labor involved and exhibits contact shift under vibration and shock; and a cermet trimming potentiometer has a greater contact noise and contact resistance than the wire-wound potentiometer, and similar to the wire-wound trimming potentiometer, exhibits contact shift under shock and vibration, has a relatively poor reliability, and has a high material and adjustment cost.

In some applications a trimming potentiometer is required to have a resistance which controls a parameter such as current which may vary such that its value is proportional to the inverse of the resistance. To vary the current linearly with setting, the reciprocal of potentiometer resistance would have to vary "linearly" with slider setting, thus manifesting a hyperbolic relation between resistance and sliding setting. Such trimming potentiometers are not commercially available, and are not feasible by conventional slider techniques. In such applications, along with the disadvantages described previously, the linearly adjustable potentiometer has the additional disadvantage that the reciprocal of the resistance becomes very nonlinear at low values of resistance.

In other applications trimming potentiometers may be connected as a continuously adjustable attenuator. In attenuator applications, all potentiometers, including wire-wound trimming potentiometers and film trimming potentiometers are disadvantageous because of their wide variation of output resistance, whereas wire-wound precision potentiometers have the added disadvantage of their expense, poor high frequency response and size.

Weighted resistor networks have been commonly utilized in D/A and A/D converters during the past 20 years to obtain a precise value of resistance or resistance ratio. Examples of discrete element weighted resistor networks used or usable in digital-to-analog converters are found in "Notes on A/D Conversion Techniques," written by A. K. Susskind, and published in 1957 by MIT Press, and in U.S. Pat. Nos. 3,723,143, Wasserman, and 2,892,147, Bell. But such networks, which have been utilized for digital control and readout of voltage, current, and resistance in instrument and control applications, have utilized high accuracy resistance elements and switches which are too large and costly to compete effectively with electromechanical trimming potentiometers. Moreover, besides the deficiencies of size and cost when considered for use in trimming potentiometer applications, these weighted D/A networks present the added difficulty that the only method available to insert them into a system and adjust them to a value of impedance satisfying the system requirements has necessitated nonvolatile-memory-containing switches which must be resettable during adjustment, yet hold setting with power off, such as latching relays, which are relatively large, expensive and unreliable, with more contacts than the trimming potentiometers.

SUMMARY OF THE PRESENT INVENTION

It is therefore an object of the present invention to provide a microminiature impedance network which is selectively fixed to a predetermined impedance with a one-time adjustment, and which provides a selectively fixed semiconductor and/or film integrated circuit impedance network in which contact problems, such as noise, slider position and resistance variation are much reduced or eliminated, thereby to improve performance and reliability.

Still another object of the present invention is to provide an economical selectively fixed semiconductor and/or film integrated circuit impedance network, the impedance or impedance ratio of which may be quickly and easily selected with the appropriate instrument.

Briefly, the present invention relates to a microminiature terminal-adjustable integrated circuit impedance device comprising a substrate, a plurality of impedance elements formed on the substrate with each element having an impedance, a first input terminal, an output terminal, a plurality of electrically permanently alterable contactless switching means formed on the substrate, each of the switching means being associated with one of the plurality of impedance elements and having initially a first switching state and being permanently alterable by application of electrical energy to an opposite switching state, an interconnecting means interconnecting the impedance elements and the switching means in a first circuit configuration between the first input terminal and the output terminal such that the impedance between the first input terminal and the output terminal is of a first value, and a plurality of adjustment terminals each being connected to a different one of the plurality of switching means for facilitating the application of electrical energy thereto to cause such switching means to change to the opposite switching state, whereby the application of electrical energy to selected ones of the adjustment terminals causes a second circuit configuration having a preselected second impedance value to be formed between the first input terminal and the output terminal. Each impedance element may be electrically inserted into or removed out of the first circuit configuration by electrically altering each associated switching means. By "inserted" or "removed" is meant electrically inserting or removing the effect of the element, not physically removing or inserting it from or into the integrated circuit.

In the preferred embodiment, thin-film, binary weighted resistive elements are formed into a series circuit configuration on a supporting substrate and fusible aluminum links are integrally formed in parallel with each element. Alternatively, the resistive elements are of the ion-implanted semiconductor type, the switching means are semiconductor diodes, and the resistive elements are configured in parallel, or in voltage divider and ladder arrangements.

An advantage of the present invention is that it provides an order of magnitude improvement in reliability, since moving mechanical parts are eliminated.

Another advantage of the present invention is that it may be mass produced as an integrated circuit at relatively low cost since assembly and test labor requirements are reduced.

Still other advantages of the present invention are that it exhibits excellent high frequency response, may be packaged in a standard integrated circuit dual-in-line (DIP) package, and is precisely set with a rapid single setting independent of operator skill.

Other objects and advantages will be apparent to those skilled in the art after having read the following detailed disclosure which makes reference to the several figures of the drawing.

IN THE DRAWING

FIG. 1 is a schematic diagram, shown in block form, of an integrated circuit impedance network formed in accordance with the present invention and an instrument for measuring and fixing its impedance.

FIG. 2 is a schematic circuit diagram of a first embodiment of the semiconductor impedance network in accordance with the present invention.

FIG. 3 is a schematic circuit diagram, shown in block form, of a second embodiment of the present invention in which the two impedance networks of FIG. 2 are configured as an ideal potentiometer.

FIG. 4 is a schematic circuit diagram of a third embodiment of the present invention in which the impedance network of FIG. 2 is configured as a nonideal potentiometer.

FIG. 5 is a schematic circuit diagram of another embodiment of the present invention in which diodes are connected in shunt across each of the impedance elements.

FIG. 6 is a schematic circuit diagram of still another embodiment of the present invention in which the network is formed by selective interconnections of a unit impedance element and shortable diodes.

FIG. 7 is a plan view of a circuit which comprises a fusible link in parallel with a weighted thin film resistive element for use in an integrated circuit impedance network in accordance with the present invention.

FIG. 8 is a plan view of a portion of a second embodiment of an integrated circuit which comprises a shortable diode connected in parallel with a weighted semiconductor resistor element for use in impedance networks in accordance with the present invention.

FIG. 9 is a schematic circuit diagram of still another embodiment of the present invention in which the impedance network comprises a plurality of weighted resistances connected in parallel.

FIG. 10 is a schematic circuit diagram of still another embodiment of the present invention in which the impedance network is configured as a ladder network.

FIG. 11 is a plan view of a portion of the network of FIG. 10 illustrating the interconnection between necked-down fusible link segments, protective resistance segments, and an adjustment terminal.

FIG. 12 is a schematic circuit diagram, similar to that of FIG. 5 in which the impedance network comprises a plurality of capacitors.

FIG. 13 is a schematic circuit diagram of another embodiment of the present invention in which back-to-back diodes are connected in shunt across each of the impedance elements.

FIG. 14 is a schematic circuit diagram of still another embodiment of the present invention in which the switching elements are comprised of series pairs of fuses and back-to-back diodes in shunt with each of the impedance elements to enable a second adjustment of the network impedance.

FIGS. 15 and 16 schematically illustrate alternative methods for attaching a conductor to the impedance network FIG. 17a is a plan view, FIG. 17b is a side elevational view, and FIG. 17c is a front elevational view of the impedance network having terminals linked with a spring clip. FIG. 17d is an enlarged fragmentary view of the circled portion of FIG. 17b.

FIG. 18 is a plan view, similar to FIG. 8, of an integrated circuit which comprises back-to-back diodes.

DETAILED DESCRIPTION OF THE PREFERRED EMBODIMENT

Referring now to FIG. 1 of the drawing, a schematic diagram, shown in block form, of a system for fixing a microminiature integrated circuit impedance network 10 in accordance with the present invention is illustrated. The network 10 is illustrated as being mounted within a package 7 that is inserted in a printed circuit board 11. Preferably, the network is packaged in a dual-in-line package (DIP) which provides access to the junctions of the network. Alternatively, the network might be packageless, and part of a hybrid integrated circuit. The system comprises an instrument, generally designated by the numeral 12, for measuring the system requirement and the network, and fixing the impedance of the network 10 as will be subsequently described. A cable assembly 14 interconnects the instrument 12 with a probe head 16. The probe head 16 closely fits over the network 10 and comprises internally therewithin terminals which are topologically disposed to electrically mate with each of the junctions between the impedance elements of the network 10 for adjustment purposes. It should be noted that if the network is part of a hybrid circuit and unpackaged, the probe would be of the needle point variety, impinging directly on points in the hybrid circuit. A conductor 18 of the cable assembly 14 is connected to a system reference terminal 19 on the printed circuit board 11 (typically ground), and a conductor 20 is connected to a system analog terminal 21.

The instrument 12 comprises a substitution resistor network 23, an analog-to-digital (A/D) logic programmer 25, a microcomputer/controller 27, a multiplexer 29, a digital-to-analog converter 31, an electronic switching and comparison network 33, visual display 35, an adjustable reference voltage 37 and appropriate switches and indicator lights 39. The details of construction of the instrument 12 are more completely described in copending U.S. patent application, Ser. No. 485,365, entitled "Apparatus for Selectively Fixing the Impedance of an Integrated Circuit Device and Method for Performing Same," by Marvin B. Rudin. Accordingly, that application is incorporated by reference herein as a part of this specification.

In accordance with the broad concept of this invention, the miniature integrated impedance network 10 comprises a plurality of weighted impedance elements which are formed on the surface 8 of substrate 9 and interconnected into a desired first circuit configuration, and electrically permanently alterable contactless switching means formed on the surface of the substrate which are associated with each of the elements for selectively inserting or removing various ones of the impedance elements from the first circuit configuration to form a second circuit configuration. The means for selectively inserting or omitting is capable of inserting or removing each of the elements permanently into or out of the circuit configuration so as to selectively fix the impedance associated with the device. By "inserting or removing" is meant electrically, not physically, inserting or removing. The impedance may be fixed either before, during, or after assembly of the impedance network into a system.

As an example of the adjustment technique and as is more completely described in the previously recited patent application, Ser. No. 485,365, briefly, the instrument 12 automatically fixes the resistance by a technique which includes taking a calibration measurement of the network 10, determining the required component value by temporary substitution of the precision adjustable substitution resistance network 23 in the system, permanently introducing either open or short circuits by means of voltage or current sources (not shown), contained within the instrument, to the several exposed internal terminals of the network 10 so as to alter the structure of the network until the resistance across the terminals of the network is within 1 resolution increment of the desired value determined by the substitution process, and thereafter permanently connecting the miniature impedance network into the system. The substitution resistance network 23 is a weighted precision resistance network, having several more elements than are contained in the network 10, which may be selectively interconnected to provide a precision resistance between its terminals. Preferably, the substitution resistance is binary weighted and its resistance is determined by successive approximation techniques which are well known in the D/A and A/D converter art.

Referring now to FIG. 2 of the drawing, a first embodiment of the microminiature impedance device or network, of the present invention is schematically illustrated. As shown therein, the impedance network comprises an input terminal 22, an output terminal 24, and seven miniature resistive elements, or resistors, 26, 28, 30, 32, 34, 36 and 38 which are connected in series between the terminals 22 and 24. The resistors 26–38 exhibit respective resistances which vary incrementally in a binary manner from R-64R as shown in FIG. 2. The set of resistors having the values described is commonly referred to as a set weighted with a binary weighting code. Connected in parallel across each of the respective resistors 26–38 is a fusible conductive link, designated by the numerals 40–52, respectively. The terminals connected to the junctions between the respective paired resistors and fusible links are referred to as adjustment terminals and are designated by numerals 53–65. One side of a calibration resistor, $R_C$, designated by the numeral 66, is connected to the input terminal 22. The other side of the calibration resistor 66 defines a terminal 68. A network output terminal 70 is accessibly disposed near the terminal 24. As shown by the dashed line, a conductor 72 interconnects the terminal 70 and the terminal 24. The conductor 72 is inserted after the proper resistive elements are inserted into or removed from the network. The conductor 72 may be inserted by attachment between terminals on a package containing the impedance network or by attachment to terminals on the circuit into which the device is to be connected.

Three methods of inserting a conductor such as that represented by the numeral 72 in FIG. 1, are illustrated schematically in FIGS. 15 and 16. In FIG. 15, the device of FIG. 2, represented by dashed lines and designated by the numeral 354, is contacted at adjustment terminals 54–64, by probe points connected to leads 362–372 of the probe 378, and at terminals 22, 70, 24 by probe points connected to leads 360, 376, 377 respectively. After the impedance requirement has been measured, the calibration impedance of the network measured, and the network impedance adjusted to the required value within the network's resolution, the function of conductor 72 may be performed by attaching a link 380, shown in dashed lines between the terminals 24 and 70 of the package. Alternatively, as shown in FIG. 15, the device 354 is connected to an external circuit 353, shown in dashed lines, having a terminal 358 connected by conductor 388 to output terminal 24, a terminal 359 disposed near terminal 358, an external conductor 390 connected to terminal 359, and an external conductor 355 connected to input terminal 22 by attaching a link 379, shown in dashed lines, between the terminals 358 and 359. Normally, one or the other alternative linking configurations will be employed, but both can be simultaneously available as shown in FIG. 15, without any adverse effects other than cost.

FIG. 16 shows still another means for attaching an external conductor to the device when the output terminal 359 is part of the external circuit 353. As shown, probe 378 contacts device 354, as previously described with reference to FIG. 15. However, since terminal 70 is not present, the lead 376 extends from the probe 378 to terminal 359 of the external circuit 353 to effect contact to the external circuit 353 for measurement of the required impedance. Again, external link 379 is attached between the terminals 358 and 359 and performs the function of conductor 72. In FIGS. 15 and 16 the external circuit may be structured as a printed circuit board or as a hybrid circuit, and the network may be a packaged or unpackaged integrated circuit chip. The probe points are structured to mate with the appropriate terminals in either case. Probes such as are commonly used in testing of integrated circuit wafers, and probes of the type clipping on integrated circuit packages, or contacting printed circuit boards for trouble shooting and checkout purposes may be employed, depending on the physical nature of the external circuit. The links 379, 380 can be simple preformed wires insertable and solderable into eyelets in the printed circuit board or substrate of the external circuit.

Attachment of a link between terminals of a package 392 is illustrated in FIG. 17. As shown, the link is comprised of a metallic spring clip 394 which snaps onto terminals 396 and 398 of the package 392, contact being assured by spring pressure at points 400 and 440. If desired, the link may be welded or soldered at the pressure points. Of course, many other methods may be used for the link function, such as a well hole in the package containing mutually insulated conductors extending from terminals 396 and 398, facilitating linking of the insulated conductors by means of a hot solder pool added to the well hole.

The resistor network is fabricated as an integral circuit with either monolithic integrated circuit or hybrid thin film integrated circuit technology. With present thin film resistor technology, resistor networks can be formed having untrimmed ratio tolerances between the most significant valued resistors (resistors 38 and 36) which are in the range between 0.05 and 0.5%. With this technology, which is well known to practitioners skilled in the thin film integrated circuit art, by carefully controlling the mask-making process, the uniformity of the deposition process, the photo masking process and the photo etching process, the ratio tolerance may be controlled between all successive resistive elements to approximately 0.1%.

The resistance between the terminals 22 and 70 is determined by the following equation:

$$R_T = \sum_{n=0}^{6} a_n 2^n R \tag{1}$$

where $R_T$ is the total resistance, and $a_n$ is the coefficient of the $n^{th}$ resistor.

In equation (1), $a_n$ is equal to either 1 or 0. If $a_n$ is 1, the fusible link in parallel with the corresponding resistive element has been opened by application of a fusing current (from the instrument 12) between the terminals across the element. If $a_n$ is 0, the link remains in the circuit.

Equation (1) expands to:

$$R_T = a_0 2^0 R + a_1 2^1 R + a_2 2^2 R + \ldots + a_6 2^6 R \tag{2}$$

From this equation it is seen that the total resistance between the terminals 22 and 24 is equal to the sum of seven terms, each of which corresponds to one of the resistive elements. As seen, the coefficient of R for each of the resistive elements is equal to $a_n 2^n$. $2^n$ is obviously the binary weighting factor. Since $a_n$ is either 1 or 0, it determines whether or not the binary resistive element is included within the series network or is bypassed as would be the case if the corresponding fuse link remains in the circuit.

It has been found that the use of binary weighted resistive elements provides the most efficient code considering the least number of resistive elements required and the corresponding least number of access terminals needed to perform the adjustment. For example, the seven weighted resistive elements in the embodiment of FIG. 2 permits adjustment within one part in 256. Consequently, any value of resistance up to 127R may be obtained within a resolution of (½)R of the desired value when each of the resistive elements has a resistance equal to its theoretically ideal weighted value. As previously stated, the resistive elements are precisely formed such that the resistance ratio between each two adjacent elements is equal to 2 within a tolerance between 0.05 and 0.5%.

It should be realized that other codes, such as the binary coded decimal code (BDC), the ternary code, codes based on the arabic numeral series with other radicies, and nonbinary weighted decimal codes may be utilized. In addition, although seven resistive elements are shown it should be realized that any number of resistive elements may be selected wherein the coefficient of the largest resistive element is equal to $2^n$.

After the value of the substitution resistance, $R_s$, which will cause the circuit to operate as desired, has been precisely determined, again by the successive approximation process, the resistance of the calibration resistor 66 is measured. From the resistance of $R_C$ and from the known value of a constant, K, of the adjustment network which is design constant, the unit resistance R may be calculated from the following equation:

$$R = KR_C \qquad (3)$$

The constant K is appropriately set through the switches 39 into the instrument 12 by the operator. The microcomputer/controller 27 stores the information relative to K, $R_C$ and $R_S$ in its memory. Thereafter, by appropriately programming the instrument, the following equation may be solved for the binary coefficients $a_n$:

$$R_s/KR_C = a_0 2^0 + a_1 2^1 + \ldots + a_6 2^6 \qquad (4)$$

Upon solving the equation, the instrument is operative to selectively interconnect through multiplexer 29 an energy source (within the network 33) to the appropriate fuse links so as to selectively open each of the links which are found to have a nonzero coefficient in equation (4). After blowing the links, the fixed adjusted resistor network is available for connection to the system. Thereafter, the final conductive link shown in FIG. 2 by the numeral 72 is connected between the terminal 24 and the output terminal 70. The resistor device of this embodiment has a resolution of one part in 256, although the resistance value of the actual resistance unit is not controllable to be within an actual resistance of between 5 and 20% of its nominal total resistance. Thus, even through 127R may have a 20% variation in full scale value, the resolution of the adjusted resistor network resistance relative to the desired setting will only be affected by 20%.

In an alternative configuration, the resistive elements may have resistances in accordance with the ternary weighting code, earlier mentioned. The resistance of the device employing the ternary code is provided by solving the following equation:

$$R_T = 1 \cdot a_0 \cdot 3^0 R + 2 \cdot b_0 \cdot 3^0 R + 1 \cdot a_1 \cdot 3^1 R + 2 \cdot b_1 \cdot 3^1 R + \\ 1 \cdot a_2 \cdot 3^2 R + 2 \cdot b_2 \cdot 3^2 R + 1 \cdot a_3 \cdot 3^3 R + 2 \cdot b_3 \cdot 3^3 R + a_4 \cdot 3^4 R \qquad (5)$$

where $R_T$ is the total resistance;
$a_n$ is the coefficient of $n^{th}$ odd resistor and is equal to 1 if its fusible link is blown and is equal to 0 if it is not blown; and
$b_n$ is the coefficient of $n^{th}$ even resistor is equal to 1 if its fusible link is blown and is equal to 0 if not.

As may be seen the resistance elements for the ternary system are R, 2R, 3R, 6R, 9R, 18R, 27R, 54R and 81R. Also, it may be seen that this network has possible redundant code values as do all series weighted networks other than binary, and therefore requires more elements and more adjustment terminals than does the binary, for a similar resolution and maximum value.

Referring now to FIG. 3 of the drawings, another embodiment of the invention is shown. In this embodiment, two linearly adjustable resistor networks 10 identical to the one illustrated in FIG. 2 are serially connected to provide an ideal potentiometer. Since the networks are identical to that of FIG. 2, identical numerals are used to designate the respective terminals. Consequently, the terminals 22 are connected together and provide the output terminal of the potentiometer. The upper resistance network, designated as $R_U$, is in a series adding relationship to the lower resistance network, designated as $R_L$. The ideal potentiometer is arranged such that the resistance between the terminals 70—70 is constant. In forming the appropriate resistance with the two networks, $R_U$ and $R_L$, two substitution resistor networks are included within the instrument (not shown). The substitution networks are initially set at an intermediate resistance and, respectively, successively raised and lowered in equal and opposite amounts such that the total resistance remains constant in the circuit until the desired resistance ratio is determined. Otherwise, the adjustment of the resistance networks $R_U$ and $R_L$ is performed in a manner similar to that described in the first embodiment.

Referring now to FIG. 4 the resistance network is illustrated as being embodied as a nonideal potentiometer. The network comprises many elements which are identical to those shown and described in the embodiment illustrated in FIG. 2 and identical numbers have been applied to those components and terminals. The resistor network is included between the terminals 80 and 82. The fundamental difference in this embodiment is that a calibration resistor 84 is connected between terminals 80 and 86, and is weighted to have a resistance which is equal to 127R, which is the sum of the resistors 26–38. Consequently, when terminals 82 and 86 are appropriately connected to terminals 88 and 90 of the external circuitry (not shown), the resistor network provides a potentiometer function. It should be recognized that the input resistance between the terminals 88 and 90 varies between 127R and twice that resistance, depending upon which of the fuses is selectively blown. This potentiometer is applicable when it is driven from a low impedance source, because such a source renders negligible the effect of the input resistance variation. As in the previous cases, the microcomputer/controller 27 of the instrument calculates the fusible links which must be selectively blown. It should be noted that resistor 84 may be either the upper or the lower resistor, with reference to FIG. 3, depending upon which resistance must be largest in the potentiometer circuit. Accordingly, assuming that an output resistance ratio greater than one-half is required, and that terminal 88 is the upper terminal, the resistance 84 is shown connected as the lower resistor. However, if it was determined that the potentiometer must provide an output resistance ratio which is lower than one-half, then the terminals 82 and 86 should be connected as shown by the dashed lines 92 and 94.

Referring now to FIG. 5, still another embodiment of the linearly adjustable resistance device is illustrated schematically. As shown therein, a microminiature integrated circuit resistance network, identical to that illustrated in FIG. 2 is connected between the terminals 22 and 24. With reference to FIG. 2, identical elements in FIG. 5 are designated by the same numerals as in FIG. 2. The fundamental difference in this embodiment is that the fusible links 40–52 have been replaced by shortable diodes 100–112 which are respectively connected in parallel with each of the resistors 26–38. In addition, the calibration resistor 66 is not included since the use of diodes will permit the direct measurement of the resistance between the terminals 22 and 24. In this embodiment the shorting of the diodes would be similar to allowing the metal fuse link described previously to remain in the circuit whereas allowing the diode to remain in the circuit would be analogous to blowing the fuse links since an open circuit would result. This embodiment lends itself for use in single polarity circuits since the unit can always be connected such that a reverse bias is applied to the diodes which have not been shorted.

It should be recognized that fusible links and shortable diodes may both be used in the same network, in various combinations to effect desirable characteristics. For example, fusible links in series with shortable diodes can permit a second adjustment, if their blow-out and breakdown currents differ. This is illustrated in FIG. 14 where a series binary weighted network similar to that of FIG. 2 contains series pairs of fuses 340-352 and back-to-back diodes 320-332 in shunt with each resistive element. On the first adjustment of the network, the back-to-back diodes shunting those resistive elements selected for elimination are permanently shorted out by application of bipolar currents too small to affect the series fuses, thereby obtaining the required value of device impedance. If a different value of device impedance is subsequently desired, it can be obtained because those unshorted impedance elements still in the circuit after the first adjustment can be selectively eliminated by means of the back-to-back diodes shunting them, and those resistive elements previously eliminated can be selectively reintroduced by blowing out their shunt fuses. To determine what adjustment control current and voltage to apply across each impedance element, the adjustment apparatus must first sence which impedance elements, if any, have been previously shorted out before proceeding with the adjustment.

Referring now to FIG. 6, an additional embodiment is shown of the device with shortable diodes. The fundamental difference in this embodiment with respect to that of FIG. 5 is that a unit resistor 120, which is illustrated as having a resistance value of 8R ohms, is used in fabricating each of the resistor elements. In addition, a diode 121 is connected in parallel with each of the unit resistors in the resistor network. Consequently, with this arrangement the resistor formed between the terminal 122 and 124 may be subjected to voltages of up to 18 times the normal voltage drop across a diode. For example, silicon diodes can be accommodated up to 0.5 volts without conducting appreciable current. Thus, the effective resistance between the terminals 122 and 124 may be subjected to voltages of up to ±9 volts without appreciable current flowing in the diodes. Under these conditions the diodes effectively act as if they are an open circuit. Since the usual voltage range of electronic circuits is generally less than 30 volts and normally only a fraction of this will appear across the resistor network, one (±9V), two (±18V), or three (±27V) diodes across each element will generally be sufficient. Alternatively, the voltage range of the circuit may be increased by replacing each diode in FIG. 5 with a pair of diodes 300-312 arranged in a back-to-back configuration as shown in FIG. 13.

Referring now to FIG. 7, a plan view is shown of two series thin film circuit elements used in many of the described embodiments of the invention. As shown, each unit is formed on the top surface 8 of the substrate 9 and comprises a thin film resistive element 130 which is connected in parallel with a fusible metal link 132.

The resistive element 130 is a strip formed of a thin film material which typically has a sheet resistivity at 1 micron thickness of about 500 to 5000 ohms per square or bulk resistivity of 0.2 ohm-centimeters. The strip is preferably of uniform width and thickness. After appropriately masking the resistive element, a layer of aluminum 134 is deposited thereover in contact with the regions 133 at the ends of the element and appropriately masked to extend parallel to it. Typically, the width of the resistor is 7 mils, the width of the aluminum is 10 mils, and the fusible link is spaced about 1 mil from the nearest edge of the resistive element. The fusible link includes an adjustment pad 131 and a necked-doen portion 136 which is typically about 0.1 to 0.5 mils wide at its most narrow point. The resistance of the link is much smaller than that across the film resistor. Accordingly, when the needle probes associated with the probe head are applied across the areas 133 via alternatively terminals 54 and 56 in FIG. 2 or adjustment pads 131 which may be connected to the terminals 54 and 56 internally within package 10, and voltage or current is applied through the probe head, and resulting current will open the link by vaporization or electromigration or both. The preselected value of the voltage or current applied should be low enough to prevent damage to the parallel resistance 28 or to the other elements of the network. Aluminum, which is preferably utilized as the material of the fusible link, is removed by the heat of vaporization when the resulting temperature developed by the applied preselected current is much higher than the melting point of aluminum. Alternatively, gold or other metals may be utilized as the fusible link. If a voltage source is applied across the fusible link power dissipation of the link may be limited so that the electromigration of the metal atoms near the necked portion creates an increase in resistance at that portion, ultimately being operative to open the circuit at that point. From the above description, it is apparent that the use of a fixed current from a current source which has no alternate path to flow except through the shunting resistor, or a voltage source across the resistor, will not destroy the resistor provided that the resistor is designed to survive that current or voltage applied. Consequently, if a current source is used, since the current flows through a cross sectional area of the link, the thickness, as well as the width, of the deposited conductor in the necked-down section must be controlled to assure a safe margin between the current limits of the resistors and the links. Typically, both the resistor film and the aluminum will be in the 1 to 2 micron range, and their current-carrying limit is in the vicinity of 10,000 amperes per square centimeter, or 0.1 milliampere per square micron. Thus, typically, the limit of a 0.5 mil aluminum link will be exceeded by a current of 5 to 10 milliamperes, while the 7 mil resistor can easily accept this current for the short time required to turn off the current source after opening the link.

Referring now to FIG. 8, a plan view is shown of two series semiconductor structures used in FIGS. 5 and 6 in which a diode is electrically connected in parallel with the resistive element on the substrate 9. Each structure comprises a diffused or ion-implanted resistor 140 having terminals 141 and 142 (shown as dashed lines) which extend from the resistor to the surface of the structure so that external connections may be made to the resistor. Also shown is a diode 145 consisting of a cathode N impurity region 146 and an anode P impurity region 147. Contact region 148 allows external connection to the cathode of diode 145 and contact region 149 allows external connection to the anode of diode 145. An aluminum conductor 150 forming an adjustment terminal 153 is connected to the cathode terminal 148 of the diode 145 and the external connection 142 of the resistor 140. Similarly, an aluminum conductor 151 is connected to the anode terminal 149 of diode 145 and to the external terminal 141 of resistor 140. Aluminum conductors 150 and 151 effectively place diode 145 in parallel with resistor 140 within the semiconductor body.

In another alternative structure, diodes may be formed using metal-to-semiconductor Schottky diode technology which is well known in the art. With a relatively minor modification, the single diode 145 of FIG. 8 can be converted to a pair of diodes in back-to-back configuration. As shown in FIG. 18, all that is required is to reduce the size of the anode region 147, and add a second anode region 143 a few microns or mils away. This forms a P-N diode junction between regions 143 and 146 in series with P-N diode junction between 147 and 146, properly connected back-to-back with region 146 being a common cathode for the diode pair.

Respecting the ion-implanted or diffused semiconductor resistive element 140, it should be emphasized that the choice of technology depends on the resistance range and ratio and absolute accuracy required. High ratio accuracies of 0.1% between resistance elements have been commercially demonstrated for both ion-implanted and diffused technology by using processes with good impurity doping uniformity, and high resolution, low distortion photomasking and etching. However, low absolute temperature coefficients (tempcos) of resistance having never been demonstrated by diffused resistors, with tempcos for them ranging from 1000 to 2500 parts per million per degree C. For this reason and the fact that ion-implanted resistors can be made with low tempcos and with higher resistivities, e.g., 10,000 to 50,000Ω per square, than either diffused or thin film resistors, the diffused resistors are mainly useful in divider applications in which only ratio is important, whereas the ion-implanted resistors are useful for both rheostat and potentiometer applications, and especially for high resistance requirements.

It should be recognized in the above descriptions of integrated circuit structures depicted in FIGS. 7 and 8, that what is referred to as the "surface" of the substrate normally is not a single plane layer, but may consist of multiple layers comprised of conductor, insulator, and semiconductor material, of thickness ranging from a few microns to a few mils. For example, the semiconductor elements of FIG. 8 are formed in not on the surface of a semiconductor substrate, but for descriptive simplicity all structures formed in layers near the surface of the substrate are referred to herein as being on the substrate. Also, it will be recognized by those skilled in the integrated circuit art, that structures may be fabricated combining film resistors and shortable semiconductor diodes, or semiconductor resistors and fusible metal links which are functional equivalents to the structures of FIGS. 7 and 8.

Referring now to FIG. 9, the resistive network is illustrated as being embodied as a hyperbolically fixable resistance device in which the resistive elements are connected in parallel. The network comprises an input terminal 160, a second terminal 162, and seven resistors 164, 166, 168, 170, 172, 174 and 176. The fundamental difference between this circuit and the circuit illustrated in FIG. 2 is that the resistors 164–176 are connected in parallel. As in the embodiment of FIG. 2, the resistors are binary weighted. Connected in series with each of the respective resistors is a fusible metal link, designated by the numerals 178–190, respectively. The junctions between the respective serially connected resistors and fusible links are designated by the numerals 192–204 and allow the selective blowing of the fuse links. One side of each of the fuse links is connected to a conductor 208. The resistance between the terminals 160 and 162 is determined by the following equation:

$$2^6/R_T = a_0 2^0 (1/R) + a_1 2^1 (1/R) + a_2 2^2 (1/R) + \ldots + a_6 2^2 (1/R) \qquad (6)$$

where $R_T$ is the total resistance, and $a_n$ is the coefficient of the $n^{th}$ resistor.

In accordance with the above equation the quantity $1/R$ becomes the linear unit of reciprocal resistance in applying the binary weighting code. Consequently, any value of $1/R_T$ up to $(127/64)(1/R)$ may be obtained within $\pm(1/128)(1/R)$ with equal resolution.

The term hyperbolic is used to designate the substantially inversely linear relationship that is maintained by the resistance of the network as the numerical selection code of equation (6) is varied linearly to control a parameter such as current which the user may want varied linearly with a constant voltage applied to the network. In such a case, because of the constant voltage, the product of current and resistance would be constant and their relation hyperbolic. Thus, with the use of the hyberbolically fixable resistance network, the codes controlling fixing of the network will allow a choice of a linear progression of values of any parameter proportional to the reciprocal of resistance.

The selection of the fusible links to be blown open is similar to that of the linearly adjustable series weighted resistor network illustrated in FIG. 2. In this embodiment, R is considered to be the most significant resistor and 64R is considered to be the least significant resistor. A calibration resistor is not required since the resistance measurement may be performed on the actual network. Subsequent to the selective blowing of the preselected fusible links, a conductive element (shown by the dashed lines 210) is connected between the terminals 162 and 208. This network is the dual of that illustrated in FIG. 2 and consequently resolution of resistance fixing decreases as the resistance increases. Although not shown, shortable diodes may be used in place of the fusible links.

Referring now to FIG. 10 a ladder network is schematically illustrated. The ladder network is fabricated by the techniques previously described. The ladder comprises a plurality of L-sections, shown in dashed lines and designated by the numeral 220. Each section includes a series resistive element 221 connected to a parallel resistive element 222. The parallel element 222 has a resistance 2R which is twice that of the series element 221. A first fusible link 223 is connected between the end 224 of the element 222 and a first conductive bus 225. A second fusible link 226 is connected between the end 224 and a second conductive bus 227. A conductor 228 is also connected to the end 224 to provide an external fusing terminal 229. At each end of the ladder termination, resistors 260, 261 and 262 having a 2R resistance value are connected. The external terminals are designated as $A_0'$ to $A_6'$ and the fusible links by $a_0'$ to $a_6'$, respectively, as shown in FIG. 10. In this embodiment one of the two links, e.g., $a_0'$ or $\bar{a}_0'$, must be blown. As is well known in digital-to-analog converter design, by selection of a binary combination of the connections of each leg to either of the busses 225 or 227, the network may provide the preselected attenuation, $\rho$, in accordance with the following formula:

$$\rho = E_2 - E_1/E_1' - E_1 \tag{7}$$

Equation (7) may be expanded and rewritten as:

$$E_2 - E_1/E_1' - E_1 = a_0 2^0 + a_1 2^{-1} + \ldots + a_n 2^{-n} \tag{8}$$

A truth table may be obtained by solving equation (8) for $E_2$ with a zero source and an infinite load impedance assumed. The truth table may be easily calculated to show the progression of output voltage $E_2$ from $E_1$ to $E_1'$ as the combination of coefficients $a_n$ varies from all 0's to all 1's.

Accordingly, for the seven-leg ladder, $\rho$ will have values between $1/3(2/128)$ and $1/3(2 \cdot 127/128)$. The resolution of this ladder network is $\pm 1/256$ and the minimum value of attenuation is $2/3(127/128)$. As the number of legs is increased, resolution will improve. The procedure by which the attenuator is adjusted is similar to that described in the previous embodiments.

The ladder may be employed as a nonideal potentiometer by use of the legs 260 and 261 in FIG. 10, in which case the attenuation of the output voltage $E_2$ referenced to either input voltage $E_1$ or $E_1'$ may be varied from 0 to 1 in 192 steps if $E_1$ and $E_1'$ are sources with negligible impedance between them. Alternatively, shortable back-to-back diodes may replace the fusible links.

Referring now to FIG. 11, a plan view is illustrated of the area of the ladder proximate the junction 224 between the two fusible links 223 and 226. Since a shunt path is available through the links 226 when the link 223 undergoes fusing, bridging or protection resistance segments 240 and 242 are inserted in series with the junction 224 and the respective fuses 223 and 226. The segments 240 and 242 have a resistance equal to r. The addition of these protection resistance segments causes no deviation in the ratio of the parallel and series resistive elements 2R and R, if a similar amount of resistance is subtracted from each 2R leg 222.

Referring now to FIG. 12, a schematic diagram is shown of a capacitive device. The device is similar to the resistive embodiment illustrated in FIG. 5. However, capacitive elements 250 are utilized in place of the resistive elements. A diode is connected in parallel across the terminals of each capacitive element. In accordance with the theory of duality, capacitive elements in series are analogous to resistive elements in parallel. In FIG. 12, a voltage is applied across the capacitor to remove it from the circuit. It should be recognized that the resistive configurations previously described with both shortable diodes and fusible links are applicable to capacitor network duals.

From the above, it will be seen that there has been provided a microminiature impedance device which includes means which are capable of permanently inserting or removing impedance elements into a circuit configuration which fulfills all of the objects and advantages set forth above.

While there has been described what is at present considered to be the preferred embodiments of the invention, it will be understood that various modifications may be made therein, and it is intended to cover in the appended claims all such modifications as fall within the true spirit and scope of the invention.

What is claimed is:

1. A microminiature terminal-adjustable integrated circuit impedance device comprising:
    an electrically insulating substrate;
    a first input terminal and an output terminal formed on said substrate;
    a plurality of impedance elements formed on said substrate and coupled together in series between said input terminal and said output terminal;
    a plurality of adjustment terminals formed on said substrate, each of said adjustment terminals being respectively connected to one side of different one of said impedance elements with each side of each impedance element having an adjustment terminal connected thereto;
    a plurality of electrically permanently alterable contactless voltage-responsive circuit elements formed on said substrate with each corresponding to one of said impedance elements and being connected in parallel therewith and between adjacent ones of said adjustment terminals, said plurality of voltage-responsive circuit elements connected as aforesaid in combination with said plurality of impedance elements causing the impedance between said input terminal and said output terminal to have a first predetermined value, each said voltage-responsive circuit element normally having a first electrical characteristic and having a second electrical characteristic different from said first electrical characteristic following the application thereacross of a predetermined voltage such that when said predetermined voltage is applied between any particular pair of said adjustment terminals, the connecting voltage-responsive circuit element is caused to assume said second electrical characteristics thereby changing the impedance between said input terminal and said output terminal to a second predetermined value.

2. A microminiature terminal-adjustable integrated circuit impedance device as recited in claim 1 and further comprising a calibration impedance element formed on said substrate, said calibration impedance element having an impedance which is directly related to that of said impedance elements whereby measurement of said calibration impedance serves to permit an indirect measurement of each of said impedance elements.

3. A microminiature terminal-adjustable integrated circuit impedance device comprising:
    an electrically insulating substrate;
    a first input terminal and an output terminal formed on said substrate;
    a plurality of electrically permanently alterable contactless voltage-responsive circuit elements formed on said substrate, each said voltage-responsive circuit element normally having a first electrical characteristic and having a second electrical characteristic different from said first electrical characteristic following the application thereacross of a predetermined voltage;

a plurality of impedance elements formed on said substrate each having one side connected to said input terminal and another side connected to said output terminal by a corresponding one of said voltage-responsive circuit elements to form a first combination of impedance elements having an impedance of a first predetermined value;

a plurality of adjustment terminals formed on said substrate each being respectively connected to one side of a corresponding one of said impedance elements such that when said predetermined voltage is applied between one of said voltage adjustment terminals and said output terminal, the voltage-responsive circuit element connected therebetween is caused to assume said second electrical characteristic thereby either effectively eliminating, or if initially eliminated, including the corresponding impedance element from said first combination to form a second combination of said impedance elements between said input terminal and said output terminal having a second predetermined impedance value.

4. A microminiature terminal-adjustable integrated circuit impedance device comprising:
a substrate;
a first plurality of impedance elements formed on said substrate with each element having an impedance;
a first input terminal;
an output terminal;
a first plurality of electrically permanently alterable contactless switching means formed on said substrate, each of said switching means being associated with one of said plurality of impedance elements and having initially a first switching state and being permanently alterable by application of electrical energy to an opposite switching state;
a first interconnecting means interconnecting said impedance elements and said switching means in a first circuit configuration between said first input terminal and said output terminal such that the impedance between said first input terminal and said output terminal is of a first value; and
a plurality of adjustment terminals each being connected to a different one of said plurality of switching means for facilitating the application of electrical energy thereto to cause such switching means to change to said opposite switching state, whereby the application of electrical energy to selected ones of said adjustment terminals causes a second circuit configuration having a preselected second impedance value to be formed between said first input terminal and said output terminal.

5. A microminiature terminal-adjustable integrated circuit impedance device as recited in claim 4 wherein the ratios of said impedance values are determined by a predetermined numerical code.

6. A microminiature terminal-adjustable integrated circuit impedance device as recited in claim 5 wherein each said impedance value is within a predetermined range.

7. A microminiature terminal-adjustable integrated circuit impedance device as recited in claim 5 wherein said numerical code comprises a set of algebraic terms, each said term being the algebraic product of a numerical coefficient and a numerical weighting factor and wherein each said coefficient is any selected one of a limited set of adjacent integers and each said weighting factor is a distinct quantity relative to any other weighting factor, said numerical code being characterized by a set of algebraic sums of said terms, each sum of said set of sums being associated with a corresponding combination of the set of possible combinations of said coefficients, and differing from the next closest sum by no more than the smallest nonzero sum of said set of sums, said numerical code being further characterized by a ratio of the number of members of said set of sums to the number of terms of said numerical code which is substantially greater than unity.

8. A microminiature terminal-adjustable integrated circuit impedance device as recited in claim 7 wherein said numerical code is a binary weighted code.

9. A microminiature terminal-adjustable integrated circuit impedance device as recited in claim 6 further comprising an externally-connectable cooperative terminal for receiving a conductive link connecting said cooperative terminal to one of said input or output terminals.

10. A microminiature terminal-adjustable integrated circuit impedance device as recited in claim 6 wherein said impedance elements are comprised of resistive elements.

11. A microminiature terminal-adjustable integrated circuit impedance device as recited in claim 10 wherein said resistive elements are comprised of a thin resistive film.

12. A microminiature terminal-adjustable integrated circuit impedance device as recited in claim 6 wherein said impedance elements are comprised of capacitive elements.

13. A microminiature terminal-adjustable integrated circuit impedance device as recited in claim 6 wherein each said switching means is connected in series with said associated one of said plurality of impedance elements.

14. A microminiature terminal-adjustable integrated circuit impedance device as recited in claim 6 wherein each said switching means is connected in parallel with said associated one of said plurality of impedance elements.

15. A microminiature terminal-adjustable integrated circuit impedance device as recited in claim 6 wherein said substrate is comprised of a block of semiconductive material.

16. A microminiature terminal-adjustable integrated circuit impedance device as recited in claim 15 wherein each said switching means comprises a semiconductor diode, said diode being shortable when subjected to current of a predetermined magnitude and polarity.

17. A microminiature terminal-adjustable integrated circuit impedance device as recited in claim 16 wherein said impedance elements are comprised of resistive elements with the resistance of one of said elements defining a unit resistance said elements being further comprised of series and parallel combinations of said unit resistance, whereby said diodes associated with said combinations of said unit resistance enhance the voltage breakdown characteristics of said device.

18. A microminiature terminal-adjustable integrated circuit impedance device as recited in claim 15 wherein each said switching means comprises a fusible conductive link.

19. A microminiature terminal-adjustable integrated circuit impedance device as recited in claim 15 wherein each said impedance element comprises an ion implanted resistor.

20. A microminiature terminal-adjustable integrated circuit impedance device as recited in claim 6 wherein said first interconnecting means connects said elements into a first series circuit configuration.

21. A microminiature terminal-adjustable integrated circuit impedance device as recited in claim 20 wherein each said switching means comprises a fusible conductive link.

22. A microminiature terminal-adjustable integrated circuit impedance device as recited in claim 21 and further comprising a calibration impedance element formed on said substrate, said calibration impedance element having an impedance which is directly related to that of said impedance elements whereby measurement of said calibration impedance serves to permit an indirect measurement of each of said impedance elements.

23. A microminiature terminal-adjustable integrated circuit impedance device as recited in claim 20 and further including a second plurality of impedance elements formed on said substrate, a second input terminal, a second plurality of electrically permanently alterable contactless switching means formed on said substrate, each of said switching means being associated with one of said second plurality of impedance elements and having initially a first switching state and being permanently alterable by application of electrical energy to an opposite switching state, a second interconnecting means interconnecting said second plurality of impedance elements and said second plurality of switching means into a second series circuit configuration between said second input terminal and said output terminal such that the impedance between said second input terminal and said output terminal is of a third value, a first end of each said first and second series circuit configuration being connected to said output terminal, a second end of said first series circuit configuration being connected to said first input terminal, and a second end of said second series circuit configuration being connected to said second input terminal, and a second plurality of adjustment terminals each being connected to a different one of said second plurality of switching means for facilitating the application of electrical energy thereto to cause such switching means to change to said opposite switching state, whereby the application of electrical energy to selected ones of said second plurality of adjustment terminals causes a third circuit configuration having a preselected fourth value to be formed between said second input terminal and said output terminal, and whereby the impedance appearing across said first and second input terminals is a preselected constant value as elements of said first and second series circuit configurations are formed into said second and third circuit configurations such that said device is formed into a fixed voltage divider within a small increment of a preselected ratio.

24. A microminiature terminal-adjustable integrated circuit impedance device as recited in claim 23 and further comprising a plurality of externally connectable cooperative terminals for receiving conductive links for connecting each respective one of said cooperative terminals to each one of said input terminals.

25. A microminiature terminal-adjustable integrated circuit impedance device as recited in claim 20 and further including a second input terminal, and an additional weighted impedance element formed on said substrate and having an impedance that is the sum of the impedances of all the elements of said first series circuit configuration, one end of said additional element being connected to one end of said first series circuit configuration and said output terminal, the other end of said additional element and the other end of said first series circuit configuration being connected to different ones of said first and second input terminals such that said device is formed into a fixable selectable voltage divider within a small increment of a preselected divider ratio.

26. A microminiature terminal-adjustable integrated circuit impedance device as recited in claim 25 wherein said impedance elements are comprised of diffused semiconductor resistors.

27. A microminiature terminal-adjustable integrated circuit impedance device as recited in claim 25 and further comprising a plurality of externally connectable cooperative terminals for receiving conductive links for connecting each one of said input terminals to a respective one of said cooperative terminals to form said preselected divider ratio.

28. A microminiature terminal-adjustable integrated circuit impedance device as recited in claim 20 wherein said substrate is comprised of a block of semiconductive material, and each said switching means is comprised of a semiconductor diode which is shortable when subjected to current of a predetermined magnitude and polarity.

29. A microminiature terminal-adjustable integrated circuit impedance device as recited in claim 6 wherein said first interconnecting means connects said elements into a parallel circuit configuration.

30. A microminiature terminal-adjustable integrated circuit impedance device as recited in claim 29 wherein each said switching means comprises a fusible conductive link.

31. A microminiature terminal-adjustable integrated circuit impedance device as recited in claim 29 wherein said substrate is comprised of a block of semiconductive material, and each said switching means is comprised of a semiconductor diode which is shortable when subjected to current of a predetermined magnitude and polarity.

32. A microminiature terminal-adjustable integrated circuit impedance device as recited in claim 4 wherein said first interconnecting means connects said elements into a ladder network, said ladder network comprising a plurality of sections, each of said sections including a series resistive element and a parallel resistive element, said parallel resistive elements having a resistance that is substantially twice the resistance of said series elements, and further comprising a first conductive bus, and a second conductive bus, said switching means including a first fusible conductive link connected between said first bus and one end of respective ones of said parallel element, and a second fusible conductive link connected between said one end of respective ones of said parallel elements and said second bus.

33. A microminiature terminal-adjustable integrated circuit impedance device as recited in claim 32 and further including a plurality of bridging resistive elements having a resistance that is much less than that of said parallel element, a first of said bridging resistive elements interconnecting said respective first links and said one end of said respective parallel elements and a second of said bridging resistive elements interconnecting said respective second links and said one end of said respective parallel elements such that the resistance of said parallel element and bridging element is twice the resistance of the respective series element.

34. A microminiature terminal-adjutable integrated circuit impedance device as recited in claim 33 wherein each of said defined resistive elements is within a tolerance of 0.5%.

35. A microminiature terminal-adjustable integrated circuit impedance device as recited in claim 33 wherein each of said links includes a necked-down portion of smaller cross section area than other portions of said link, said necked-down portion tending to disappear in response to a minimum preselected current flowing through said link, thereby causing said link to become an open circuit which inserts said element associated with said link into said second circuit configuration.

36. A microminiature terminal-adjustable integrated circuit impedance device as recited in claim 33 wherein each of said links includes a necked-down portion of smaller cross section area than other portions of said link, said necked-down portion tending to disappear in response to a minimum preselected voltage applied to adjacent ones of said element terminals across said link, thereby causing said link to become an open circuit which inserts said element associated with said link into said second circuit configuration.

37. A microminiature terminal-adjustable integrated circuit impedance device as recited in claim 32 including a second parallel resistive element having one end connected to the first one of said sections, and third and fourth parallel resistive elements having one end connected to the last one of said sections, said second, third and fourth parallel resistive elements having a resistance that is substantially twice the resistance of said series elements, whereby said device in said second circuit configuration is characterized by a fixed attenuation having a value between, and including, 0 and 1.

* * * * *